(12) United States Patent
Lee et al.

(10) Patent No.: US 7,515,503 B2
(45) Date of Patent: Apr. 7, 2009

(54) HIGH VOLTAGE TRANSFER CIRCUIT AND ROW DECODER CIRCUIT COMPRISING A HIGH VOLTAGE TRANSFER CIRCUIT

(75) Inventors: Jong-Hoon Lee, Suwon-si (KR); Yong-Taek Jeong, Daegu-si (KR); Jin-Kook Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 287 days.

(21) Appl. No.: 11/634,061

(22) Filed: Dec. 6, 2006

(65) Prior Publication Data

US 2007/0268774 A1 Nov. 22, 2007

(30) Foreign Application Priority Data

May 19, 2006 (KR) .................. 10-2006-0045276

(51) Int. Cl.
*G11C 8/00* (2006.01)
(52) U.S. Cl. ............................ 365/230.06; 365/189.09; 365/189.11
(58) Field of Classification Search ............ 365/230.06, 365/189.09, 189.11
See application file for complete search history.

(56) References Cited

U.S. PATENT DOCUMENTS

| 4,488,060 | A | 12/1984 | Simko |
| 5,315,188 | A | 5/1994 | Lee |
| 5,729,172 | A * | 3/1998 | Tsukada ................. 327/536 |
| 5,939,927 | A | 8/1999 | Myers |
| 6,501,323 | B2 | 12/2002 | Nakamura |
| 6,801,060 | B2 * | 10/2004 | Ikehashi et al. ............ 327/80 |
| 6,977,850 | B2 | 12/2005 | Tanzawa |

FOREIGN PATENT DOCUMENTS

| JP | 2000235799 A | 8/2000 |
| JP | 2001243786 A | 9/2001 |
| JP | 2003-015753 | 1/2003 |
| KR | 1019900007929 B1 | 10/1990 |

* cited by examiner

*Primary Examiner*—Son Dinh
(74) *Attorney, Agent, or Firm*—Volentine & Whitt, PLLC

(57) ABSTRACT

Embodiments of the invention provide a high voltage transfer circuit, a row decoder circuit comprising the high voltage transfer circuit, and a non-volatile semiconductor memory device comprising the high voltage transfer circuit. In one embodiment, the invention provides a high voltage transfer circuit of a semiconductor memory device comprising a high voltage switch comprising a high voltage transistor comprising a first terminal connected to a boosted voltage via a first depletion-type transistor and comprising a second terminal connected to an output node via a second depletion-type transistor. The high voltage transfer circuit further comprises a driver circuit adapted to drive the first and second depletion-type transistors and the high voltage transistor in response to an input signal.

26 Claims, 5 Drawing Sheets

HIGH VOLTAGE TRANSFER CIRCUIT AND ROW DECODER CIRCUIT COMPRISING A HIGH VOLTAGE TRANSFER CIRCUIT

BACKGROUND

1. Field of the Invention

Embodiments of the invention relates to a non-volatile semiconductor memory device. In particular, embodiments of the invention relate to a high voltage transfer circuit, a row decoder circuit comprising the high voltage transfer circuit, and a non-volatile semiconductor memory device comprising the high voltage transfer circuit.

This application claims priority to Korean Patent Application 2006-45276, filed on May 19, 2006, the subject matter of which is hereby incorporated by reference in its entirety.

2. Description of Related Art

A semiconductor memory device may be generally classified as a volatile semiconductor memory device or a non-volatile semiconductor memory device. Dynamic random access memory (DRAM) and a static random access memory (SRAM) are types of volatile semiconductor memory. While volatile semiconductor memory devices have the benefit of relatively fast read and write speeds, they have the disadvantage of losing the data stored in memory cells when power is not supplied to the device.

Mask read only memory (MROM), programmable read only memory (PROM), erasable programmable read only memory (EPROM), electrically erasable programmable read only memory (EEPROM), and the like are types of non-volatile semiconductor memory. Data stored in memory cells of a non-volatile semiconductor memory device can be retained even when power is not supplied to the device, so non-volatile semiconductor memory devices are mainly used to store data that must be retained regardless of whether power is being supplied. Users cannot readily erase MROM, PROM, or EPROM using just the electronic system in which a device of one of those types is disposed. However, an EEPROM device may be erased and written to electrically using the electronic system in which the device is disposed. Thus, the application of EEPROM has widened to auxiliary storage units or system program storage units in need of continuous updating.

Flash memory is a type of EEPROM, and a flash memory device performs a program operation using a hot electron injection mechanism in which electrons are injected to a floating gate of the memory cell from a channel region adjacent to a drain region of the memory cell. A memory cell is programmed by grounding source and substrate regions of the memory cell and applying a high voltage of about 9V to a control gate of the memory cell. At this time, the drain region is supplied with a voltage of about 5V, which is appropriate to generate hot electrons. As a result of the program operation, negative electrons are accumulated on the floating gate, thus increasing a threshold voltage of the memory cell. During an erase operation, a negative voltage of about −9V is applied to the control gate and a voltage of about 9V is applied to a bulk region of the memory cell. In accordance with this bias condition, negative electrons accumulated on the floating gate are discharged to the bulk region, which lowers the threshold voltage of the memory cell. A read operation is performed by applying a voltage of about 1V to the drain region, a voltage lower than a threshold voltage of the programmed memory cell to the control gate, and 0V to the source. If the memory cell on which the read operation is performed is programmed, then the memory cell is determined to be an "off-cell," and if the memory cell is erased, then the memory cell is determined to be an "on-cell". During a read operation, a voltage having a level that is between the threshold voltage of a programmed memory cell and the threshold voltage of an erased memory cell (which may be referred to hereinafter as a read voltage) is applied to a word line connected to a selected memory cell.

In addition, a flash memory device uses a boosted voltage that is higher than a power supply voltage. A row decoder circuit of the flash memory device is a circuit of the flash memory device that needs the boosted voltage. As is well known in the art, a flash memory device uses a relatively high voltage (i.e., a boosted voltage) of about 23V in order to perform program and erase operations. In addition, a high voltage switch is used to control the boosted voltage (i.e., the high voltage).

Figures (FIGS.) 1 to 3 are circuit diagrams illustrating conventional high voltage transfer circuits.

Referring to FIG. 1, a high voltage transfer circuit consists of a high-voltage PMOS transistor HV-PMOS acting as a switch and a level shifter. In general, the high-voltage PMOS transistor HV-PMOS has a low breakdown voltage between a drain and a source. For this reason, when the high-voltage PMOS transistor HV-PMOS is turned OFF and a relatively low voltage such as 0V is applied to an output node OUT, a voltage difference between the source and the drain of the high-voltage PMOS transistor HV-PMOS becomes large, which may cause a breakdown to occur (i.e., may cause a breakdown phenomenon).

FIG. 2 also illustrates a high voltage transfer circuit. The high voltage transfer circuit illustrated in FIG. 2 is substantially the same as the high voltage transfer circuit illustrated in FIG. 1, except that a high-voltage NMOS transistor HV-NMOS is used instead of the high-voltage PMOS transistor HV-PMOS of FIG. 1. As is well known in the art, high-voltage NMOS transistor HV-NMOS has a high breakdown voltage, so it is free from the breakdown phenomenon that may occur in the high voltage transfer circuit illustrated in FIG. 1. However, in order to transfer a boosted voltage VPP (i.e., a boosted voltage VPP) to output node OUT when the high-voltage NMOS transistor HV-NMOS is turned ON, a DC bias voltage greater than a voltage of (VPP+Vth) must be applied to a gate of high-voltage NMOS transistor HV-NMOS. In general, it is difficult to generate a voltage as high as boosted voltage VPP used in the flash memory device. Thus, generation of a voltage (i.e., the DC bias voltage) higher than boosted voltage VPP may cause various problems such as increase in current consumption, increase in chip size, and the like.

Another conventional high voltage transfer circuit, which is illustrated in FIG. 3, comprises a depletion-type transistor connected between boosted voltage VPP and a high-voltage PMOS transistor HV-PMOS. Boosted voltage VPP or a voltage of 0V is applied to a gate of the depletion-type transistor. In accordance with this configuration, it is possible to solve the breakdown phenomenon described above by preventing boosted voltage VPP from being applied to high-voltage PMOS transistor HV-PMOS when high-voltage PMOS transistor HV-PMOS is turned OFF (i.e., during a switch-off state). However, when a high voltage is applied to output node OUT, a breakdown phenomenon may occur when high-voltage PMOS transistor HV-PMOS is turned OFF (i.e., when high-voltage PMOS transistor HV-PMOS is in a switch-off state). Further, when a power supply voltage is lower than a threshold voltage Vthd of the depletion-type transistor during a low voltage operation in which an operating voltage lower than a conventional power supply voltage is used, leakage current may be generated when high-voltage PMOS transistor HV-PMOS is turned OFF. In order to prevent the leakage current from being generated, the high voltage transfer circuit requires a DC bias voltage Vbias received from outside of the high voltage transfer circuit, as illustrated in FIG. 3.

SUMMARY OF THE INVENTION

In one embodiment, the invention provides a high voltage transfer circuit of a semiconductor memory device comprising a high voltage switch comprising a high voltage transistor comprising a first terminal connected to a boosted voltage via a first depletion-type transistor and comprising a second terminal connected to an output node via a second depletion-type transistor. The high voltage transfer circuit further comprises a driver circuit adapted to drive the first and second depletion-type transistors and the high voltage transistor in response to an input signal. In addition, the driver circuit is adapted to provide a first voltage to both a gate and the first terminal of the high voltage transistor when the input signal is in an inactive state.

In another embodiment, the invention provides a row decoder circuit disposed in a semiconductor memory device comprising a high voltage pump adapted to generate a boosted voltage, and a voltage ramper comprising a high voltage transfer circuit and adapted to receive the boosted voltage and generate a program voltage having a slope and a voltage appropriate for the program voltage to be used in a write operation of the semiconductor memory device. The row decoder circuit further comprises a word line driver adapted to receive the boosted voltage from the high voltage pump, adapted to receive the program voltage from the voltage ramper, and adapted to drive word lines in response to an external address. In addition, the high voltage transfer circuit comprises a high voltage transistor connected to the boosted voltage via a first depletion-type transistor and connected to an output node of the high voltage transfer circuit via a second depletion-type transistor.

In another embodiment, the invention provides a semiconductor memory device comprising a memory cell array comprising memory blocks, and a row decoder comprising a voltage ramper adapted to generate a program voltage having a predetermined slope and voltage, wherein the row decoder is also adapted to decode a word line address signal and provide one of at least one voltage to each of at least one word line of one of the memory blocks in accordance with an activated block word line signal. In addition, the voltage ramper comprises a high voltage transfer circuit comprising a high voltage transistor, wherein the high voltage transistor is connected to a boosted voltage via a first transistor and to an output node via a second transistor, wherein each of the first and second transistors are depletion-type NMOS transistors.

DESCRIPTION OF EMBODIMENTS

Figure 1:
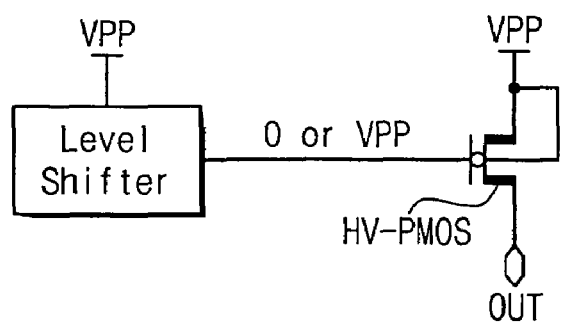
FIGS. 1 to 3 are circuit diagrams illustrating conventional high voltage transfer circuits.
Figure 2:
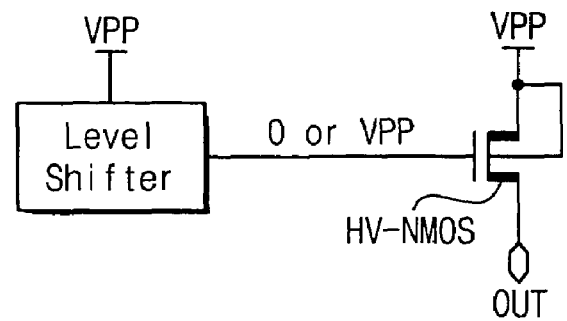
Figure 3:
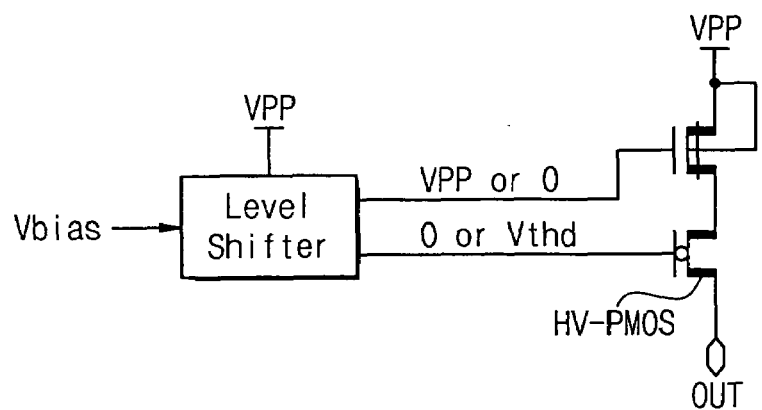
Figure 4:
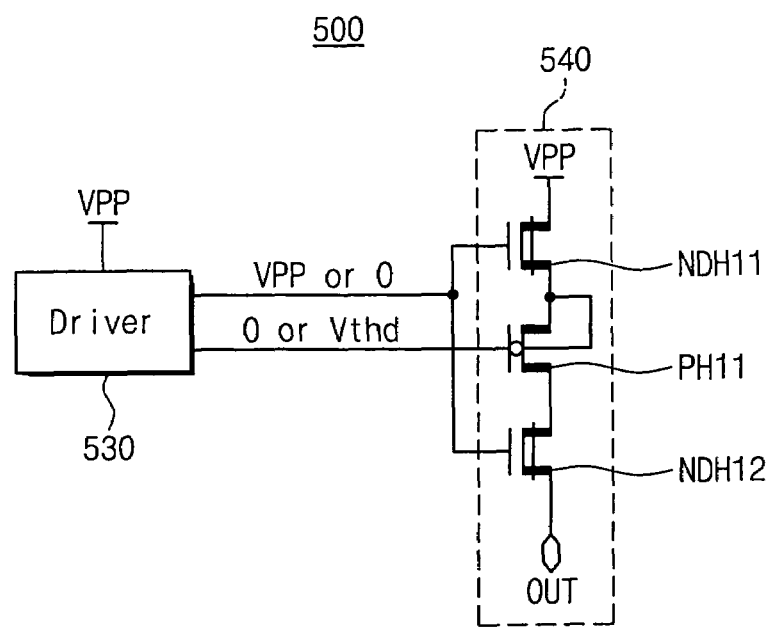
FIG. 4 is a circuit diagram showing a high voltage transfer circuit in accordance with an embodiment of the invention.

FIG. 4 is a circuit diagram showing a high voltage transfer circuit 500 in accordance with an embodiment of the invention.

Referring to FIG. 4, high voltage transfer circuit 500 comprises a driver circuit 530 and a high voltage switch 540. As illustrated in FIG. 4, high voltage switch 540, in accordance with an embodiment of the invention, comprises a depletion-type transistor NDH11 connected to one side of a high-voltage PMOS transistor PH11 and a depletion-type transistor NDH12 connected to another side of high-voltage PMOS transistor PH11. The threshold voltage of a depletion-type transistor is a threshold voltage (−Vthd), and when high voltage switch 540 is in an OFF state, driver circuit 530 applies threshold voltage Vthd to a gate of high-voltage PMOS transistor PH11. When that occurs, since the gate of depletion-type transistor NDH11 receives a voltage of 0V, a voltage of Vthd (which is the absolute value of a threshold voltage of depletion-type transistor NDH11) is applied to a first drain/source terminal of high-voltage PMOS transistor PH11, wherein the first drain/source terminal of high-voltage PMOS transistor PH11 disposed nearer to a boosted voltage VPP node 542 (of FIG. 5) than is a second drain/source terminal of high-voltage PMOS transistor PH11. Likewise, although any voltage may be applied to output node OUT (i.e., output terminal OUT), a voltage lower than the voltage of Vthd is applied to the second drain/source terminal of high-voltage PMOS transistor PH11, which is disposed nearer to output node OUT than the first drain/source terminal. Thus, no breakdown phenomenon is generated. When high voltage switch 540 is in an ON state, a voltage of 0V is applied to a gate of high-voltage PMOS transistor PH11, and boosted voltage VPP (which is the voltage applied to boosted voltage VPP node 542) is applied to a gate of each of depletion-type transistors NDH11 and NDH12. Also when high voltage switch 540 in the active state, boosted voltage VPP is applied to a source of high-voltage PMOS transistor PH11 via depletion-type transistor NDH11, and the boosted voltage VPP provided to high-voltage PMOS transistor PH11 is then provided to output node OUT through depletion-type transistor NDH12 without a voltage drop.

As used herein, when high-voltage switch 540 is said to be ON or in an ON state, it means that boosted voltage VPP is provided to output node OUT through high-voltage switch 540, and when high-voltage switch 540 is said to be OFF or in an OFF state, it means that boosted voltage VPP is not provided to high-voltage switch 540 through high-voltage switch 540.

As can be seen from the above description, depletion-type transistors NDH11 and NDH12 prevent high-voltage PMOS transistor PH11 from breaking down.

Figure 5:
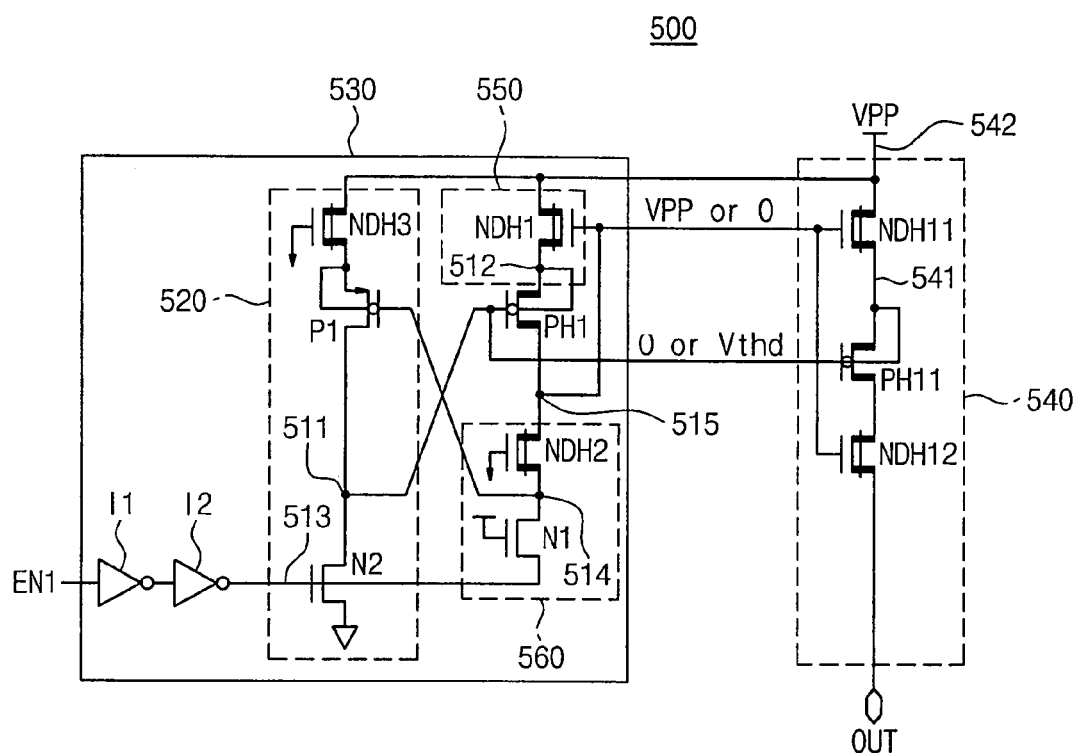
FIG. 5 is a circuit diagram showing the high voltage transfer circuit illustrated in FIG. 4 in more detail.

FIG. 5 is a circuit diagram showing high voltage transfer circuit 500 of FIG. 4 in some additional detail. FIG. 5 shows driver circuit 530 and high voltage switch 540 of FIG. 4. As will be described in more detail below, driver circuit 530 of FIG. 5 is adapted to track a voltage apparent at a source of high-voltage PMOS transistor PH11 and supply the gate of high-voltage PMOS transistor PH11 with the same voltage as the voltage apparent at the source of high-voltage PMOS transistor PH11. In accordance with this tracking scheme, it is possible to eliminate leakage current when high voltage switch 540 is OFF without using an externally applied bias voltage.

Referring to FIG. 5, high voltage transfer circuit 500 comprises a boosted voltage VPP node 542 that receives a boosted voltage VPP (i.e., a high voltage VPP). In addition, driver circuit 530, in accordance with an embodiment of the invention, comprises a feedback circuit 550, a switch transistor PH1, a DC path blocking circuit 520, and a discharge circuit 560. Feedback circuit 550 comprises feedback transistor NDH1, and discharge circuit 560 comprises an NMOS transistor N1 and a depletion-type NMOS transistor NDH2. The gate of NMOS transistor N1 is connected to a power supply voltage, and the gate of depletion-type NMOS transistor NDH2 is connected to a ground voltage. Driver circuit 530 further comprises inverters I1 and I2.

The feedback transistor NDH1 is a high-voltage depletion-type NMOS transistor. A gate of feedback transistor NDH1 is connected to a common gate node 515 of depletion-type transistors NHD11 and NDH12 of high voltage switch 540, and feedback transistor NDH1 is adapted to change a voltage of a node 512 in accordance with the level of a voltage apparent on common gate node 515. That is, feedback transistor NDH1 is adapted to output an output voltage (i.e., an output voltage of feedback transistor NDH1) to node 512, wherein the output voltage of feedback transistor NDH1 varies in accordance with the level of a voltage apparent on common gate node 515. In the embodiment illustrated in FIG. 5, switch transistor PH1 is a high-voltage PMOS transistor. Switch transistor PH1 is turned ON when an enable signal EN1 (i.e., an input signal EN1) is in an active state (e.g., when enable signal EN1 has a logic high level) and transfers a voltage apparent on node 512 to common gate node 515. Thus, the voltage apparent on common gate node 515 may attain the voltage level of boosted voltage VPP (i.e., the voltage level of a boosted voltage VPP).

DC path blocking circuit 520 turns ON switch transistor PH1 when enable signal EN1 is in an active state and turns OFF switch transistor PH1 when enable signal EN1 is in an inactive state (e.g., when enable signal EN1 has a logic low level). To control switch transistor PH1, when enable signal EN1 is in an active state, DC path blocking circuit 520 sets the voltage apparent at a node 511 to a ground voltage and provides that ground voltage to a gate of switch transistor PH1. In addition, when enable signal EN1 is in an inactive state, DC path blocking circuit 520 sets the voltage apparent at node 511 to be greater than or equal to a voltage apparent at a source of switch transistor PH1 (i.e., a voltage apparent on a node 512) and provides that voltage to the gate of switch transistor PH1.

DC path blocking circuit 520 comprises a depletion-type NMOS transistor NDH3, a PMOS transistor P1, and an NMOS transistor N2.

A gate of depletion-type NMOS transistor NDH3 is connected to a ground voltage, so, because a threshold voltage of depletion-type NMOS transistor NDH3 is (−Vthd), which is lower than 0V, depletion-type NMOS transistor NDH3 is always turned ON. Thus, a voltage apparent at the drain of depletion-type NMOS transistor NDH3 is greater than the voltage apparent at its gate by Vthd. That is, the voltage apparent at the drain of depletion-type NMOS transistor NDH3 is about Vthd.

Operations of high voltage transfer circuit 500 in accordance with an embodiment of the invention will be described in more detail subsequently with reference to the accompanying drawings. First, the operation of high voltage transfer circuit 500 when enable signal EN1 is in an active state will be described. High voltage transfer circuit 500 may be described as being in an active state when enable signal EN1 is in an active state. Similarly, high voltage transfer circuit 500 may be described as being in an inactive state when enable signal EN1 is in an inactive state.

When enable signal EN1 is in an active state, an output voltage of inverter I2 is a power supply voltage VCC and the level of a voltage apparent on output node 513 goes to the level of power supply voltage VCC. NMOS transistor N2 of DC path blocking circuit 520 is controlled in accordance with the output voltage of inverter I2. When the output voltage of inverter I2 is a power supply voltage VCC (and therefore the level of the voltage apparent on output node 513 goes to the level of power supply voltage VCC), NMOS transistor N2 is turned ON by the output voltage of inverter I2. Thus, a voltage apparent at node 511 (which is the same as the voltage apparent at the gate of switch transistor PH1) goes to a logic low level, so switch transistor PH1 is turned ON. Additionally, because the voltage apparent at node 511 goes to a logic low level, the gate of switch transistor PH11 also receives a voltage having a logic low level (e.g., a voltage of 0V) and is therefore turned ON. Assuming that an initial voltage apparent on common gate node 515 is 0V and that a threshold voltage of feedback transistor NDH1 is about −Vthd, a voltage apparent at node 512 (i.e., the output voltage of feedback transistor NDH1) is about Vthd. The voltage apparent at node 512 is transferred to common gate node 515 through switch transistor PH1, which is turned ON. Accordingly, a voltage apparent on common gate node 515 increases to a voltage of Vthd. If the voltage apparent on common gate node 515 goes to a voltage of Vthd, the level of the voltage apparent at node 512 becomes 5V. The level of the voltage apparent on common gate node 515 then increases to 5V. Thus, as the voltage apparent on common gate node 515 is fed back to the gate of feedback transistor NDH1, the voltages apparent on node 512 and common gate node 515, respectively, gradually increase so that the level of the voltage apparent on common gate node 515 will attain the level of boosted voltage VPP (i.e., high voltage VPP).

In addition, a voltage apparent at a node 514 goes to a voltage of Vthd due to depletion-type NMOS transistor NDH2, which turns OFF PMOS transistor P1 of DC path blocking circuit 520. When PMOS transistor P1 is turned OFF, an electrical path between boosted voltage VPP and node 511 is blocked (i.e., is electrically disconnected). In addition, no path between common gate node 515 and a ground voltage is formed. If driver circuit 530 causes a voltage apparent on common gate node 515 to reach boosted voltage VPP, depletion-type NMOS transistors NDH11 and NDH12, each of which is connected to a side of switch transistor PH11, are each fully turned ON. Thus, when enable signal EN1 is in an active state, a voltage apparent on node 511 is lowered to a ground voltage via NMOS transistor N2, so switch transistor PH1 connected to node 511 is turned ON and switch transistor PH11 is turned ON. In addition, depletion-type NMOS transistors NDH11 and NDH12 are each fully turned ON, so output node OUT will receive boosted voltage VPP (i.e., high voltage VPP).

An operation of high voltage transfer circuit 500 of FIG. 5 when enable signal EN1 is in an inactive state (i.e., when high voltage transfer circuit 500 is in an inactive state) will now be described. When enable signal EN1 is in an inactive state, a voltage apparent at node 513, that is, an output voltage of inverter I2, is 0V. Thus, NMOS transistor N2 of DC path blocking circuit 520 is turned OFF. In addition, a voltage apparent at node 514 goes to 0V through NMOS transistor N1, and PMOS transistor P1 of DC path blocking circuit 520 is turned ON when the voltage apparent at node 514 goes to 0V. Thus, a voltage apparent at node 511, that is, a voltage apparent at the gate of switch transistor PH1 goes to Vthd, so switch transistor PH1 is turned OFF. In addition, the voltage apparent at a source of switch transistor PH1 (which is the same as the voltage apparent at node 512) is the same as or similar to the voltage apparent at the gate of switch transistor PH1 (which is the same as the voltage apparent at node 511). Since switch transistor PH1 is turned OFF when enable signal EN1 is in an inactive state, no leakage current is generated. That is, no DC path is formed between boosted voltage VPP node 542 and a ground voltage.

Transistors N1 and NDH2 are ON when enable signal EN1 is in an inactive state, so a voltage of common gate node 515 is discharged when enable signal EN1 is in an inactive state. That is, when enable signal EN1 is in an inactive state, transistors N1 and NDH2 form a discharge path from common gate node 515 to a ground voltage output by inverter I2. Thus, a voltage (i.e., boosted voltage VPP) apparent on common gate node 515 is lowered to a ground voltage level. Accordingly, depletion-type NMOS transistors NDH11 and NDH12 connected to different sides of high-voltage PMOS transistor PH11, respectively, transfer a voltage of Vthd to a node 541 because a voltage greater than a threshold voltage (−Vthd) of each of transistors NDH11 and NDH12 is provided to the respective gates of those transistors. In addition, because a voltage of Vthd is apparent at node 511, the voltage Vthd is provided to the gate and a source/drain terminal of high-voltage PMOS transistor PH11, which causes output node OUT to float.

As may be understood from the above description, it is possible to prevent leakage current from flowing by providing substantially the same voltage (i.e., bias condition) to the gate of switch transistor PH11 and a source/drain terminal of switch transistor PH11. In a case in which a threshold voltage of a depletion-type transistor varies due to process variations, the leakage current may flow as a voltage apparent at a drain or source terminal of switch transistor PH11 becomes greater than the voltage apparent at its gate.

Figure 6:
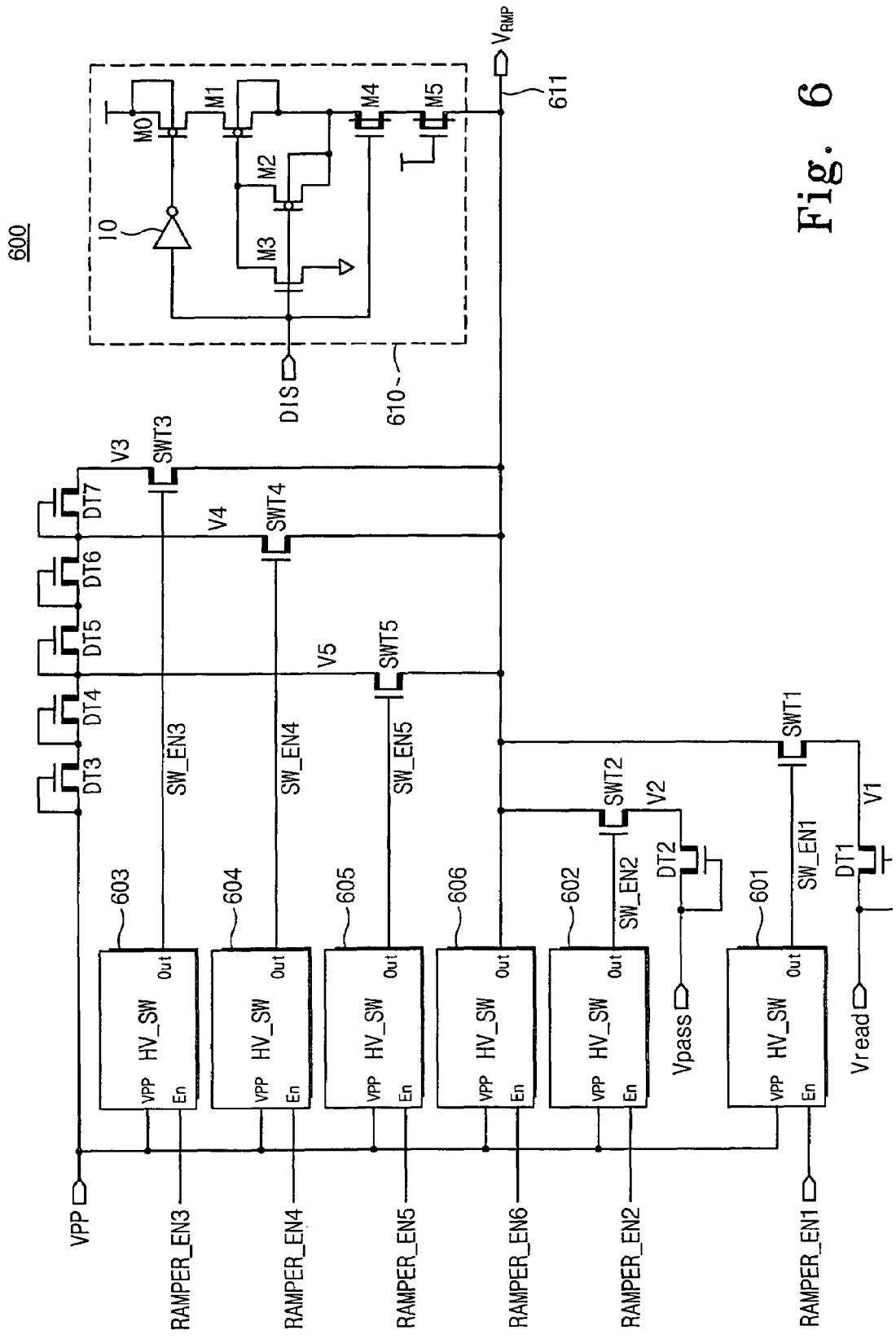
FIG. 6 is a block diagram showing a voltage ramper comprising the high voltage transfer circuit illustrated in FIG. 4; and, FIG. 7 is a block diagram showing a flash memory device comprising the voltage ramper illustrated in FIG. 6.

FIG. 6 is a circuit diagram showing a voltage ramper comprising a high voltage transfer circuit in accordance with an embodiment of the invention. As illustrated in FIG. 6, a voltage ramper 600 comprises a plurality of high voltage transfer circuits 601 to 606, each of which is substantially the same as high voltage transfer circuit 500 illustrated in FIG. 5. Thus, detailed description of the operation of each of high voltage transfer circuits 601 to 606 illustrated in FIG. 6 is omitted. Voltage ramper 600 further comprises a plurality of NMOS transistors DT1 to DT7 and SWT1 and SWT5. NMOS transistors DT1 and SWT1 are connected in series between an output terminal 611 and a read voltage Vread. A ramper voltage $V_{RMP}$ is used as a program voltage or a block word line voltage and is output via output terminal 611. A gate of NMOS transistor DT1 is connected to receive read voltage Vread, and a gate of NMOS transistor SWT1 is connected to receive an output signal of high voltage transfer circuit 601, that is, a switch enable signal SW_EN1. NMOS transistors DT2 and SWT2 are connected in series between a pass voltage Vpass and output terminal 611. A gate of NMOS transistor DT2 is connected to receive pass voltage Vpass, and a gate of NMOS transistor SWT2 is connected to receive an output signal of high voltage transfer circuit 602, that is, a switch enable signal SW_EN2. Diode-connected transistor DT1 (i.e., NMOS transistor DT1) forms a circuit that drops read voltage Vread and generates a drop voltage (e.g., V1), and diode-connected transistor DT2 (i.e., NMOS transistor DT2) forms a circuit that drops pass voltage Vpass and generates a drop voltage (e.g., V2).

NMOS transistors DT3 to DT7 are connected in series between boosted voltage VPP and NMOS transistor SWT3, and the gates of NMOS transistors DT3 to DT7 are connected so that each of NMOS transistors DT3 to DT7 operates as a diode. Diode-connected transistors DT3 to DT7 form a circuit that drops (i.e., reduces) boosted voltage VPP and generates a plurality of drop voltages (e.g., V3, V4, and V5). NMOS transistor SWT3 is connected between a source of transistor DT7 and output terminal 611, and is controlled in accordance with a switch enable signal SW_EN3 received from high voltage transfer circuit 603. NMOS transistor SWT4 is connected between a source of NMOS transistor DT6 and output terminal 611, and is controlled in accordance with a switch enable signal SW_EN4 received from high voltage transfer circuit 604. NMOS transistor SWT5 is connected between a source of NMOS transistor DT4 and output terminal 611, and is controlled in accordance with a switch enable signal SW_EN5 received from high voltage transfer circuit 605.

Voltage ramper 600 further comprises a ramper discharge circuit 610 that is connected to output terminal 611 and discharges a voltage apparent on output terminal 611 to a power supply voltage in response to a control signal DIS. Ramper discharge circuit 610 comprises PMOS transistors M0, M1, and M2; NMOS transistors M3, M4, and M5; and an inverter I0. Those transistors and inverter I0 are connected as illustrated in FIG. 6. In FIG. 6, transistors DT1 to DT7, SWT1 to SWT5, M4, and M5 may each be a high-voltage transistor adapted to endure boosted voltage VPP.

Figure 7:
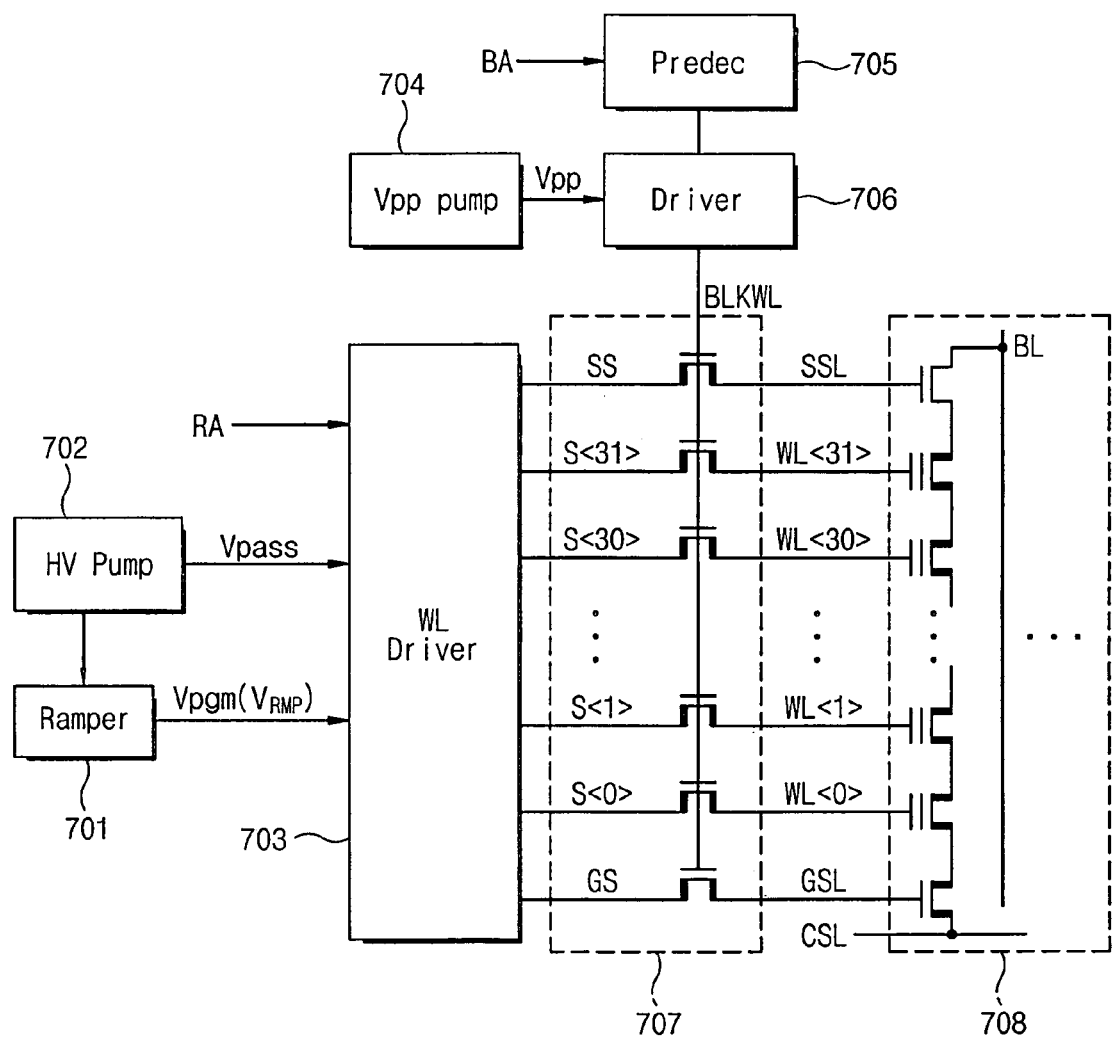

FIG. 7 is a block diagram showing a flash memory device comprising voltage ramper 600 of FIG. 6. The flash memory device of FIG. 7 comprises a memory cell array, of which a selected cell string 708 is shown in FIG. 7. In addition, the memory cell array comprises memory blocks. Referring to FIG. 7, a high voltage pump 702 generates a boosted voltage VPP (i.e., high voltage) needed for operations of a flash memory device. A voltage ramper 701, in accordance with an embodiment of the invention, comprises a high voltage transfer circuit. Voltage ramper 701 receives boosted voltage VPP from high voltage pump 702 and generates a program voltage Vpgm (i.e., a ramper voltage $V_{RMP}$) having a proper slope. A word line driver 703 receives a word line address signal RA and is adapted to decode word line address signal RA. In addition, word line driver 703 receives a program voltage Vpgm from voltage ramper 701, receives a pass voltage Vpass from high voltage pump 702, and provides appropriate voltages to a block decoder 707 during a program operation. Block decoder 707 receives relatively high voltages needed for a program operation from word line driver 703 and selectively transfers the received high voltages to word lines WL0 to WL31 in response to a block word line signal BLKWL corresponding to a block address BA. In particular, since output signals SS, S<0> to S<31>, and GS of word line driver 703 each has a relatively high voltage, a high voltage pump 704 and a block decoder driver 706 may drive block word line signal BLKWL with a voltage necessary to transfer the high voltages of output signals SS, S<0> to S<31>, and GS without voltage drop. A pre-decoder 705 decodes block address BA, and block decoder driver 706 determines whether to provide boosted voltage VPP to block decoder 707 in accordance with the decoded address of pre-decoder 705. A program operation may be performed on a selected cell string 708 via a row decoder comprising voltage ramper 701, high voltage pump 702, word line driver 703, pre-decoder 705, block decoder driver 706, and block decoder 707.

As set forth above, it is possible to effectively transfer a high voltage without a breakdown phenomenon occurring and without an additional bias voltage. Further, it is possible to reduce leakage current.

Although embodiment of the invention have been described herein, it will be apparent to those of ordinary skill in the art that various substitutions, modifications, and changes may be in the embodiments without departing from the scope of the invention as defined by the accompanying claims.

What is claimed is:

1. A high voltage transfer circuit of a semiconductor memory device comprising:
    a high voltage switch comprising a high voltage transistor having a first terminal connected to a boosted voltage via a first transistor and a second terminal connected to an output node via a second transistor; and,
    a driver circuit adapted to drive the high voltage switch in response to an input signal,
    wherein the driver circuit is adapted to provide a first voltage to the gate and the first terminal of the high voltage transistor when the input signal is inactive.

2. The high voltage transfer circuit of claim 1, wherein the high voltage transistor is a first PMOS transistor, and the first and second transistors are depletion-type NMOS transistors; and,
    the driver circuit comprises:
        a feedback circuit connected to the boosted voltage and adapted to generate a first output voltage, wherein the first output voltage varies in accordance with a level of a voltage apparent on a common gate node of the first and second transistors;
        a switch adapted to transfer the first output voltage to the common gate node; and,
        a DC path blocking circuit adapted to turn on the switch when the input signal is in an active state and adapted to turn off the switch when the input signal is in the inactive state.

3. The high voltage transfer circuit of claim 2, wherein:
    the feedback circuit comprises a third transistor controlled in accordance with the level of the voltage apparent on the common gate node and connected between the boosted voltage and the switch, wherein the third transistor is a depletion-type NMOS transistor; and,
    the switch comprises a second high voltage PMOS transistor connected between the third transistor and the common gate node and is controlled in accordance with a second output voltage output by the DC path blocking circuit.

4. The high voltage transfer circuit of claim 2, further comprising:
    a discharge circuit adapted to discharge the voltage apparent on the common gate node when the input signal is in the inactive state.

5. The high voltage transfer circuit of claim 4, wherein the discharge circuit comprises:
    a third transistor comprising a gate connected to a ground voltage, a drain connected to the common gate node, and a source, wherein the third transistor is a depletion-type NMOS transistor; and,
    a fourth transistor comprising a gate connected to a power supply voltage, a drain connected to the source of the third transistor, and a source connected to a ground voltage via an inverter when the input signal is inactive, wherein the inverter is adapted to receive an inverted version of the input signal.

6. The high voltage transfer circuit of claim 5, wherein the DC path blocking circuit comprises:
    a fifth transistor comprising a gate connected to a ground voltage, a source connected to the boosted voltage, and a drain, wherein the fifth transistor is a depletion-type NMOS transistor;
    a PMOS transistor comprising a source connected to the drain of the fifth transistor, a gate connected to the drain of the fourth transistor, and a drain; and,
    a sixth transistor connected between the drain of the PMOS transistor and a ground voltage and controlled in accordance with an output signal of the inverter.

7. The high voltage transfer circuit of claim 6, wherein, when the input signal is inactive, a voltage corresponding to an absolute value of a threshold voltage of at least one of the first and second transistors is applied to the gate of the high voltage transistor.

8. A row decoder circuit in a semiconductor memory device comprising:
    a high voltage pump adapted to generate a boosted voltage;
    a voltage ramper comprising a high voltage transfer circuit and adapted to receive the boosted voltage and generate a program voltage having a slope and a voltage appropriate for the program voltage to be used in a write operation of the semiconductor memory device; and,
    a word line driver adapted to receive the boosted voltage from the high voltage pump, adapted to receive the program voltage from the voltage ramper, and adapted to drive word lines in response to an external address,
    wherein the high voltage transfer circuit comprises a high voltage transistor connected to the boosted voltage via a first transistor and connected to an output node of the high voltage transfer circuit via a second transistor.

9. The row decoder circuit of claim 8, wherein the high voltage transistor is a high voltage PMOS transistor, and the first and second transistors are NMOS depletion-type transistors.

10. The row decoder circuit of claim 9, wherein, when the high voltage transfer circuit is in an inactive state, a voltage corresponding to an absolute value of a threshold voltage of at least one of the first and second transistors is applied to the gate of the high-voltage transistor.

11. The row decoder circuit of claim 10, wherein, when the high voltage transfer circuit is in the inactive state, a voltage corresponding to a ground voltage is applied to gates of the first and second transistors.

12. The row decoder circuit of claim 9, wherein, when the high voltage transfer circuit is in an active state, a voltage corresponding to a ground voltage is applied to the high-voltage transistor.

13. The row decoder circuit of claim 12, wherein, when the high voltage transfer circuit is in the active state, a voltage applied to a boosted voltage node of the high voltage transfer circuit is applied to gates of the first and second transistors.

14. The row decoder circuit of claim 8, wherein the high voltage transfer circuit further comprises a driver circuit.

15. The row decoder circuit of claim 14, wherein the driver circuit is adapted to:
    connect the output node to the boosted voltage via the first and second transistors and the high voltage transistor when an enable signal is activated by controlling the first and second transistors and the high voltage transistor; and,
    isolate the output node from the boosted voltage when the enable signal is deactivated by controlling the first and second transistors and the high voltage transistor.

16. The row decoder circuit of claim 15, wherein the driver circuit comprises:
a feedback circuit connected to a common gate node of the first and second transistors and adapted to generate a first output voltage, wherein the first output voltage varies in accordance with a level of a voltage apparent on the common gate node;
a switch adapted to transfer the first output voltage to the common gate node; and,
a DC path blocking circuit adapted to turn on the switch when the enable signal is in an active state and adapted to turn off the switch when the enable signal is in an inactive state.

17. The row decoder circuit of claim 16, wherein:
the feedback circuit comprises a depletion-type NMOS transistor controlled in accordance with the level of the voltage apparent on the common gate node and connected between the boosted voltage and the switch; and,
the switch comprises a PMOS transistor connected between the depletion-type NMOS transistor and the common gate node and is controlled in accordance with a second output voltage output by the DC path blocking circuit.

18. A semiconductor memory device comprising:
a memory cell array comprising memory blocks; and,
a row decoder comprising a voltage ramper adapted to generate a program voltage having a predetermined slope and voltage, wherein the row decoder is also adapted to decode a word line address signal and provide one of at least one voltage to each of at least one word line of one of the memory blocks in accordance with an activated block word line signal,
wherein the voltage ramper comprises a high voltage transfer circuit comprising a high voltage transistor, wherein the high voltage transistor is connected to a boosted voltage via a first transistor and to an output node via a second transistor, wherein the first and second transistors are depletion-type NMOS transistors.

19. The semiconductor memory device of claim 18, wherein the high voltage transfer circuit comprises:
a feedback circuit connected to a common gate node of the first and second transistors and adapted to generate a first output voltage, wherein the first output voltage varies in accordance with a level of a voltage apparent on the common gate node;
a switch adapted to transfer the first output voltage to the common gate node; and,
a DC path blocking circuit adapted to turn on the switch when an enable signal is active and adapted to turn off the switch when the enable signal is inactivate.

20. The semiconductor memory device of claim 19, wherein:
the feedback circuit comprises a third transistor controlled in accordance with the level of the voltage apparent on the common gate node and connected between the boosted voltage and the switch, wherein the third transistor is a depletion-type NMOS transistor; and,
the switch comprises a high-voltage PMOS transistor connected between the third transistor and the common gate node and is controlled in accordance with a second output voltage output by the DC path blocking circuit.

21. The semiconductor memory device of claim 20, wherein, when the high voltage transfer circuit is in the inactive state, a ground voltage is provided to gates of the first and second transistors.

22. The semiconductor memory device of claim 19, wherein:
the high voltage transfer circuit further comprises a discharge circuit adapted to discharge the voltage apparent on the common gate node when the enable signal is in the inactive state; and,
the discharge circuit comprises:
a third transistor comprising a gate connected to a ground voltage, a drain connected to the common gate node, and a source, wherein the third transistor is a depletion-type NMOS transistor; and,
a fourth transistor comprising a gate connected to a power supply voltage, a drain connected to the source of the third transistor, and a source connected to a ground voltage via an inverter when the input signal is in the inactive state, wherein the inverter is adapted to receive an inverted version of the enable signal.

23. The semiconductor memory device of claim 22, wherein the DC path blocking circuit comprises:
a fifth transistor comprising a gate connected to a ground voltage, a source connected to the boosted voltage, and a drain, wherein the fifth transistor is a depletion-type NMOS transistor;
a PMOS transistor comprising a source connected to the drain of the fifth transistor, a gate connected to the drain of the fourth transistor, and a drain; and,
a sixth NMOS transistor connected between the drain of the PMOS transistor and a ground voltage and controlled in accordance with an output signal of the inverter.

24. The semiconductor memory device of claim 19, wherein the high voltage transistor is a high-voltage PMOS transistor.

25. The semiconductor memory device of claim 24, wherein, when the high voltage transfer circuit is in an inactive state, a voltage corresponding to an absolute value of a threshold voltage of at least one of the first and second transistors is applied to a gate of the high-voltage PMOS transistor.

26. The semiconductor memory device of claim 18, wherein the semiconductor memory device is a flash memory device.

* * * * *